United States Patent
Roiz et al.

(10) Patent No.: US 11,522,500 B2
(45) Date of Patent: Dec. 6, 2022

(54) DUAL-PATH AMPLIFIER HAVING REDUCED HARMONIC DISTORTION

(71) Applicant: NXP USA, Inc., Austin, TX (US)

(72) Inventors: Arturo Roiz, Tempe, AZ (US); Justin Nelson Annes, Chandler, AZ (US); Terry L. Thomas, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 132 days.

(21) Appl. No.: 16/675,623

(22) Filed: Nov. 6, 2019

(65) Prior Publication Data

US 2021/0135634 A1    May 6, 2021

(51) Int. Cl.
*H03F 1/32*    (2006.01)
*H03F 3/21*    (2006.01)
*H05K 1/02*    (2006.01)

(52) U.S. Cl.
CPC .............. *H03F 1/32* (2013.01); *H03F 3/211* (2013.01); *H05K 1/025* (2013.01); *H05K 1/0243* (2013.01); *H03F 2200/375* (2013.01); *H03F 2200/451* (2013.01); *H03F 2203/21103* (2013.01); *H03F 2203/21106* (2013.01); *H03F 2203/21139* (2013.01); *H03F 2203/21142* (2013.01); *H05K 2201/09227* (2013.01)

(58) Field of Classification Search
CPC .. H03F 1/32; H03F 3/211; H03F 2203/21106; H03F 2200/451; H03F 2203/21142; H03F 2200/375; H03F 2203/21139; H03F 2203/21103; H05K 1/025; H05K 1/0243; H05K 2201/09227
USPC .............................................. 330/295, 124 R
See application file for complete search history.

(56) References Cited

U.S. PATENT DOCUMENTS

| | | | |
|---|---|---|---|
| 6,670,801 B2 | 12/2003 | Jian et al. | |
| 8,164,387 B1 | 4/2012 | Apel et al. | |
| 9,337,784 B2 | 5/2016 | Kim et al. | |
| 2009/0096525 A1* | 4/2009 | Staszewski | H03F 3/189 330/277 |

(Continued)

OTHER PUBLICATIONS

Kim, Jangheon et al., "Advanced Design of Linear Doherty Amplifier for High Efficiency using Saturation Amplifier," IEEE/MTT-S International Microwave Symposium, Jun. 2007, pp. 1573-1576.

*Primary Examiner* — Samuel S Outten
*Assistant Examiner* — Khiem D Nguyen

(57) ABSTRACT

An embodiment of a dual-path amplifier includes a power splitter connected to first and second power amplifiers respectively connected to first and second transmission lines connected to a power combiner having a phase-offset deficit at the second harmonic frequency 2f0, where the first and second transmission lines are designed to provide a complementary phase offset at 2f0 substantially equal to the phase-offset deficit such that the two amplified signals will be combined at the power converter with a total phase offset at 2f0 of about 180 degrees in order to reduce harmonic distortion in the amplified output signal, without substantially diminishing the output power at the fundamental frequency f0. In certain PCB-based implementations, the transmission lines include metal traces and lumped elements providing different impedance transformations that achieve the complementary phase offset, where the metal traces may have significantly different physical and electrical characteristics.

6 Claims, 6 Drawing Sheets

(56) References Cited

U.S. PATENT DOCUMENTS

2013/0099866 A1\* 4/2013 Conradi .................... H03F 1/56
                                                        330/295
2014/0368297 A1\* 12/2014 Darwish ................. H03F 3/211
                                                        333/136

\* cited by examiner

DUAL-PATH AMPLIFIER HAVING REDUCED HARMONIC DISTORTION

TECHNICAL FIELD

Embodiments of the subject matter described herein relate generally to amplifiers, and more particularly to dual-path power amplifiers having two parallel amplification paths.

BACKGROUND

Wireless communication systems employ power amplifiers for increasing the power of radio frequency (RF) signals. In a cellular base station, for example, a dual-path power amplifier may form a portion of the last amplification stage in a transmission chain before provision of the amplified signal to an antenna for radiation over the air interface. High gain, high linearity, stability, and a high level of power-added efficiency are characteristics of a desirable power amplifier in such a wireless communication system.

FIG. 1 is a simplified schematic circuit diagram of a conventional dual-path Class AB power amplifier 100 having a power splitter 120, two parallel amplification paths 130(1) and 130(2), and a power combiner 140, where each amplification path 130(1), 130(2) has an amplifier 132(1), 132(2) and a transmission line 136(1), 136(2) that connects the output of the amplifier 132(1), 132(2) to the power combiner 140. Those skilled in the art will understand that real-world implementations of the dual-path amplifier 100 may have additional components that are not shown in FIG. 1.

The power splitter 120 divides an input signal 112 received at input node 110 into two different signal components 122(1) and 122(2). In some implementations, the power splitter 120 is a 50-50 splitter that divides the input signal 112 into two components 122(1) and 122(2) having substantially equal power levels.

Each amplifier 132(1), 132(2) amplifies its corresponding component 122(1), 122(2) to generate a corresponding amplified component 134(1), 134(2) that gets injected into the corresponding transmission line 136(1), 136(2). As understood by those skilled in the art, the electrical characteristics of each transmission line 136(1), 136(2) result in some degree of attenuation and some amount of phase shift as the corresponding amplified component 134(1), 134(2) traverses the transmission line 136(1), 136(2) towards the power combiner 140.

The power combiner 140 receives and combines the components 138(1) and 138(2) output from the two respective transmission lines 136(1) and 136(2) to generate an amplified output signal 142 at the output node 150. In order to optimize the power of the amplified output signal 142, in conventional, real-world implementations, the two transmission lines 136(1) and 136(2) are specifically designed to have substantially identical electrical characteristics at the fundamental frequency of operation, f0, of the amplifier 100, so that the two components 138(1) and 138(2) will be combined at the power combiner 140 with minimal losses at that fundamental frequency.

FIG. 2 is a simplified, top view of a conventional, real-world implementation 200 of the dual-path amplifier 100 of FIG. 1 on a printed circuit board (PCB) 205. Mounted onto the PCB 205 is a packaged integrated circuit (IC) device 232 that contains the two amplifiers 132(1) and 132(2) of FIG. 1. The two transmission lines 136(1) and 136(2) of FIG. 1 are implemented using two respective metal traces 236(1) and 236(2) on the PCB 205.

According to a known technique, the power splitter 120 and the power combiner 140 of FIG. 1 are implemented as two instances 220 and 240 of the same discrete, hybrid coupler that are mounted onto the PCB 205 and respectively configured to operate symmetrically as a power splitter and a power combiner. In a typical conventional implementation, the hybrid coupler has been specifically designed to operate optimally at the relevant fundamental frequency, f0. As known in the art, when configured as the power splitter 220, the first instance of the hybrid coupler outputs the two signal components 122(1) and 122(2) having a phase offset substantially equal to 90 degrees at the fundamental frequency. Similarly, when configured as the power combiner 240, the second instance of that same hybrid coupler applies a symmetric phase offset substantially equal to 90 degrees between the two amplified signal components 138(1) and 138(2) at the fundamental frequency as the components are being combined such that the combined effect of the two symmetric 90-degree phase offsets results in (substantially) zero net phase offset at the fundamental frequency when the two components are combined. This zero net phase offset at the fundamental frequency is achieved by applying the 90-degree phase offset symmetrically to each path: one at the power splitter 220 and the other at the power combiner 240.

In such a conventional implementation, the physical layouts of the two metal traces 236(1) and 236(2) are specifically designed to be mirror images of each other, such that the two metal traces will have substantially identical electrical characteristics at the fundamental frequency. Accordingly, the respective phase shifts applied by the two metal traces 236(1) and 236(2) to the two amplified components 134(1) and 134(2) output from the amplifiers 132(1) and 132(2) at the fundamental frequency will be substantially identical, so that the optimal signal combining at the power combiner 240 at the fundamental frequency is not adversely impacted by the metal traces.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
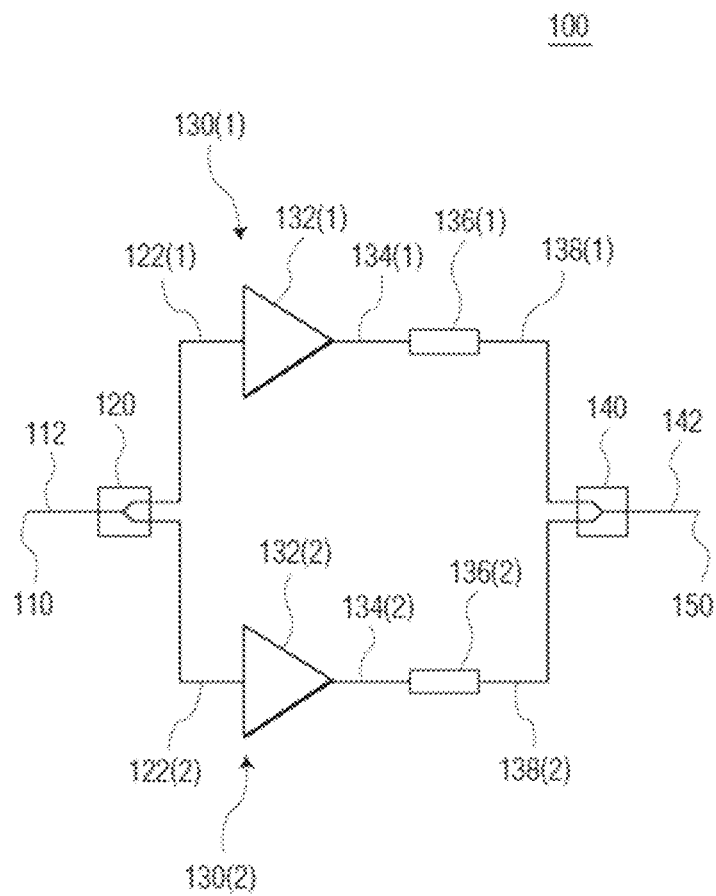
FIG. 1 is a simplified schematic circuit diagram of a conventional dual-path Class AB power amplifier.
Figure 2:
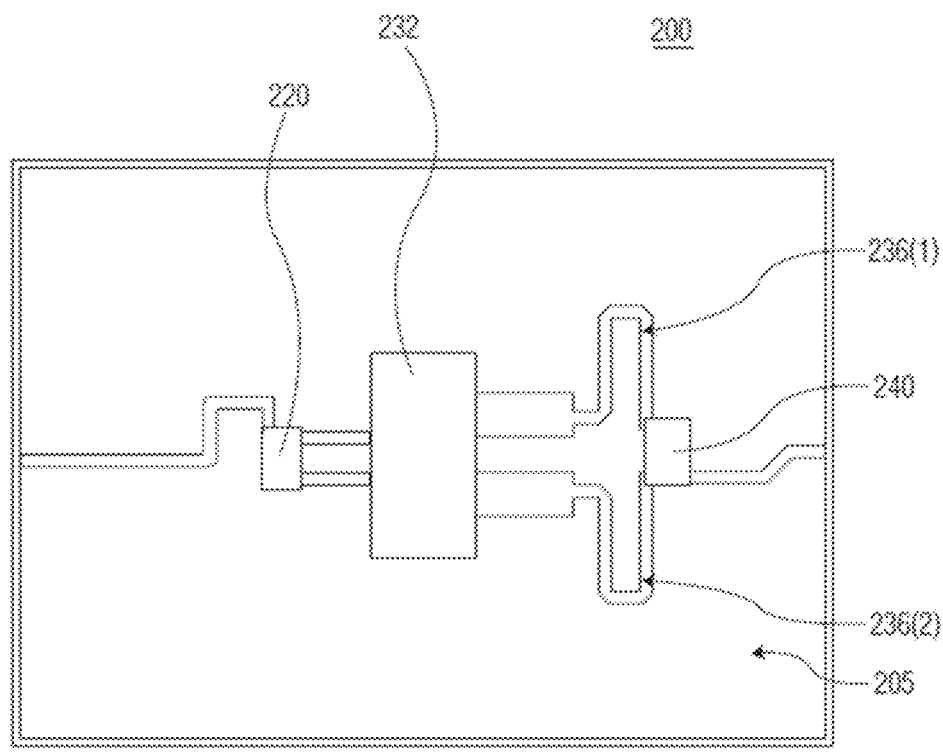
FIG. 2 is a simplified, top view of a conventional, real-world implementation of the dual-path amplifier of FIG. 1 on a printed circuit board.

As described above, in conventional practice, the metal traces 236(1) and 236(2) in the PCB-based implementation 200 of FIG. 2 for the dual-path amplifier 100 of FIG. 1 are intentionally designed to have physical shapes that are mirror images of one another such that the metal traces have substantially identical electrical characteristics at the fundamental frequency of operation (f0) of the amplifier 100. Such a design achieves optimal combining of the two amplified signal components 138(1) and 138(2) at the fundamental frequency. However, such a design strategy ignores the distortion that can occur in the output signal 142 at frequencies other than the fundamental frequency, for example, at the second harmonic frequency (i.e., twice the fundamental frequency or 2f0).

In an ideal implementation, a hybrid coupler having a 90-degree phase offset at the fundamental frequency (f0) would have a 180-degree phase offset at the second harmonic frequency (2f0) corresponding to that fundamental frequency. In such an ideal implementation, the power splitter 120 would output the two signal components 122(1) and 122(2) with a 90-degree phase offset at f0 and a 180-degree phase offset at 2f0. Furthermore, the power combiner 140 would ideally apply a complementary 90-degree phase offset at f0 and a complementary 180-degree phase offset at 2f0.

Note that the amplifiers 132(1) and 132(2) operate to amplify the signal components 122(1) and 122(2) at the fundamental frequency f0 (i.e., signal energy at the fundamental frequency). Nevertheless, nonlinear amplification characteristics of the amplifiers 132(1) and 132(2) will introduce signal distortion into the amplified signals 134(1) and 134(2) such that the amplified signals 134(1) and 134(2) output from the amplifiers 132(1) and 132(2) will contain amplified signal components at the fundamental frequency f0 as well as harmonic distortion components of the fundamental frequency f0 at frequencies 2f0, 3f0, 4f0, etc. In addition, the electrical characteristics of the transmission lines 134(1) and 134(2) can impact and increase the magnitude of the signal energy at the second harmonic frequency 2f0 in the amplified signals 138(1) and 138(2) that are applied to the hybrid power combiner 140 when the amplified signals 138(1) and 138(2) combine out of phase (i.e., with a phase offset of 180 degrees).

In an ideal implementation in which the power combiner 140 applies a 90-degree phase offset at f0 and a 180-degree phase offset at 2f0, the 180-degree phase offset at 2f0 will result in a destructive interference between the two signals at 2f0, thereby reducing harmonic distortion in the output signal 142.

In real-world implementations, however, a hybrid coupler having a 90-degree phase offset at the fundamental frequency f0 will not have a 180-degree phase offset at the second harmonic frequency 2f0. For example, a real-world hybrid coupler designed to have a 90-degree phase offset at f0, might have a phase offset at 2f0 of only about 135 degrees. In that case, when the two amplified signals 138(1) and 138(2) are combined at the power combiner 140, the 135-degree phase offset will result in imperfect cancellation of the signal energy at 2f0 leading to undesirable harmonic distortion in the output signal 142.

Figure 3:
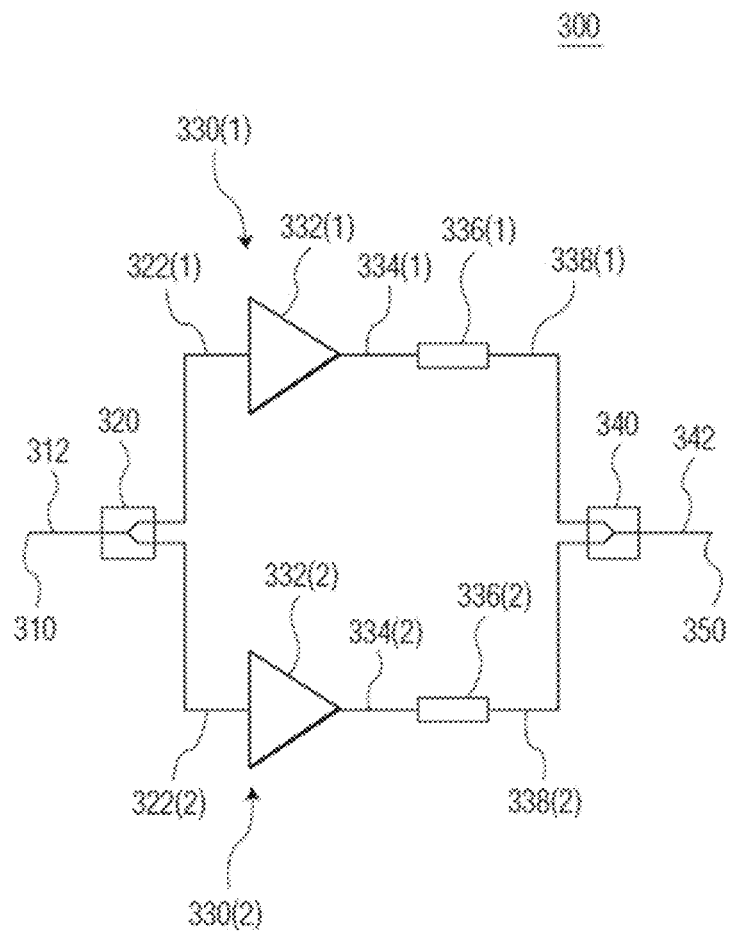
FIG. 3 is a simplified schematic circuit diagram of a dual-path Class AB power amplifier, according to certain embodiments of the present disclosure.

FIG. 3 is a simplified schematic circuit diagram of a dual-path Class AB power amplifier 300, according to certain embodiments of the present disclosure. As shown in FIG. 3, the power amplifier 300 has a power splitter 320, two parallel amplification paths 330(1) and 330(2), and a power combiner 340, where each amplification path 330(1), 330(2) has an amplifier 332(1), 332(2) and a transmission line 336(1), 336(2) that connects the output of the amplifier 332(1), 332(2) to the power combiner 340. Those skilled in the art will understand that real-world implementations of the dual-path amplifier 300 may have additional components that are not shown in FIG. 3.

The power splitter 320 divides an input signal 312 received at its input node 310 into two different signal components 222(1) and 222(2) at its two output nodes. In some implementations, the power splitter 320 is a 50-50 splitter that divides the input signal 312 into two components 322(1) and 322(2) having substantially equal power levels.

Each amplifier 332(1), 332(2) amplifies its corresponding component 322(1), 322(2) to generate a corresponding amplified component 334(1), 334(2) that gets injected into the corresponding transmission line 336(1), 336(2). As understood by those skilled in the art, the electrical characteristics of each transmission line 336(1), 336(2) result in some degree of attenuation and some amount of phase shift as the corresponding amplified component 334(1), 334(2) traverses the transmission line 336(1), 336(2) towards the power combiner 340.

The power combiner 340 receives, at its two input ports, the components 338(1) and 338(2) output from the two respective transmission lines 336(1) and 336(2) to generate an amplified output signal 342 at its output node 350.

As will be described in detail below, a significant difference between the power amplifier 300 of FIG. 3 and the prior-art power amplifier 100 of FIG. 1 is that the transmission lines 336(1) and 336(2) of FIG. 3 are specifically designed to have different physical and electrical characteristics such that the phase offset between the two transmission lines at the second harmonic frequency 2f0 substantially compensates for a non-zero phase-offset deficit of the power combiner 340 at 2f0 without significantly impacting the phase offset between the two transmission lines at the fundamental frequency f0. In the prior-art power amplifier 100 of FIG. 1, the transmission lines 136(1) and 136(2) are specifically designed to be mirror images of one another having identical electrical characteristics such that there is no substantial phase offset between the two transmission lines at the fundamental frequency f0 without any regard for the phase offset between the two transmission lines at the second harmonic frequency 2f0.

Those skilled in the art will understand that, when the power amplifier 300 is implemented on a printed circuit board, each transmission line 336(1), 336(2) may be implemented using various impedance elements that provide different combinations of inductance, capacitance, and/or resistance that contribute to the overall phase shift between the output of the amplifier 332(1), 332(2) and the corresponding input to the power combiner 340. For example, a segment of a metal trace formed on the PCB substrate may be used to provide inductance. Similarly, bond wires and other types of leads may also be used to provide inductance. Lumped capacitors connected in series or shunt configurations may be used to provide capacitance. In one possible implementation, each transmission line 336(1), 336(2) of FIG. 3 may be implemented as a PCB metal trace having a number of interconnected trace segments with a lumped capacitor connected in a shunt configuration to one end of the metal trace, where the two transmission lines 336(1) and 336(2) have different electrical lengths and different impedances at 2f0.

A goal of the present disclosure is to design the two transmission lines 336(1) and 336(2) to have different electrical characteristics such that, at the second harmonic frequency 2f0, the phase offset resulting from traversing the transmission lines combined with the phase offset induced by the hybrid power combiner 340 will be close to 180 degrees without significantly affecting the phase match at the fundamental frequency f0, such that the signal components will substantially destructively interfere at 2f0 with minimal mismatch losses at f0. When the transmission lines 336(1) and 336(2) are designed and the power combiner 340 is configured such that their respective phase offsets are cumulative, those phase offsets are said to be complementary.

According to certain real-world implementations of the present disclosure, the transmission lines 336(1) and 336(2) of the dual-path amplifier 300 of FIG. 3 are specifically designed to compensate for the deficiency in the phase offset imposed by the power combiner 340 at the second harmonic frequency. The two transmission lines 336(1) and 336(2) can be practically implemented on a printed circuit board to have a phase offset up to about 80 degrees at 2f0. As long as the phase-offset deficit of the power combiner 340 at 2f0 is no more than about 80 degrees, the transmission lines 336(1) and 336(2) can be implemented to have a complementary phase offset that compensates for that phase-offset deficit.

Thus, for example, for a power combiner 340 that imposes a 135-degree phase offset at 2f0, the transmission lines 336(1) and 336(2) are specifically designed to achieve a complementary phase offset of about 45 degrees at 2f0 such that the total net phase offset at 2f0 will be about 180 degrees so that significant harmonic cancellation will occur when the two amplified signals 338(1) and 338(2) are combined at the power combiner 340. In addition, in order not to significantly adversely affect the constructive interference at the fundamental frequency f0, the transmission lines 336(1) and 336(2) are also specifically designed to impose a phase offset substantially close to zero at f0.

In general, for each transmission line 336(1), 336(2) the impedance Zload presented to the power combiner 340 of FIG. 3 is given by Equation (1) as follows:

$$Zload = Zo * \frac{Zout + j * Zo * \text{Tan}[B\ell]}{Zo + j * Zout * \text{Tan}[B\ell]}, \quad (1)$$

where:

Zo is the impedance of the corresponding transmission line 336(1), 336(2);

Zout is impedance from the corresponding amplifier 332(1), 332(2) that injects an amplified signal 334(1), 334(2) into the transmission line 336(1), 336(2); and Bl is the phase length of the transmission line 336(1), 336(2).

In order to achieve substantially uniform performance across the frequency band of interest about the fundamental frequency f0, each transmission line 336(1), 336(2) should have the same amount of mismatch loss (in dB) at f0, which can be achieved by designing both transmission lines 336(1) and 336(2) to have the same complex power reflection coefficient $\Gamma$. This can be accomplished by designing the transmission lines 336(1) and 336(2) to have the same voltage standing wave ratio (VSWR) given by Equation (2) as follows:

$$VSWR = \frac{(1+\Gamma)}{(1-\Gamma)} \quad (2)$$

$$\Gamma = \Gamma_{Re} + i\Gamma_{Im} = \frac{(Zload - ZoComb)}{(Zload + ZoComb)} \quad (3)$$

$$\rho = \sqrt{\Gamma_{Re}^2 + \Gamma_{Im}^2} \quad (4)$$

$$\theta = \arctan\left(\frac{\Gamma_{Im}}{\Gamma_{Re}}\right) \quad (5)$$

$\Gamma_{Re}$ and $\Gamma_{Im}$ are the real and imaginary components of the complex power reflection coefficient $\Gamma$, ZoComb is the impedance from the power combiner 340, $\rho$ is the magnitude of the power reflection coefficient $\Gamma$, and $\theta$ is the phase angle of the power reflection coefficient $\Gamma$.

Equation (3) can be re-written as Equation (6) as follows:

$$Zload = ZoComb \frac{(1+\Gamma)}{(1-\Gamma)} \quad (6)$$

The phase shift Ø of a transmission line 336(1), 336(2) is given by Equation (7) as follows:

$$\emptyset = \arctan\frac{\rho * \sin(180 - \theta)}{1 - \rho * \cos(180 - \theta)} \quad (7)$$

Equation (1) can be re-written as Equation (8) as follows:

$$Zo = j\frac{1}{2} * \cot[B\ell] * \quad (8)$$

$$\left(Zout - Zload + \sqrt{\frac{((Zout - Zload)^2 -}{(4 * Zload * Zout * \tan[B\ell)]^2)}}\right)$$

where:

$$B\ell = \frac{\lambda}{0.25} * \frac{\pi}{2} \quad (9)$$

Figure 4:
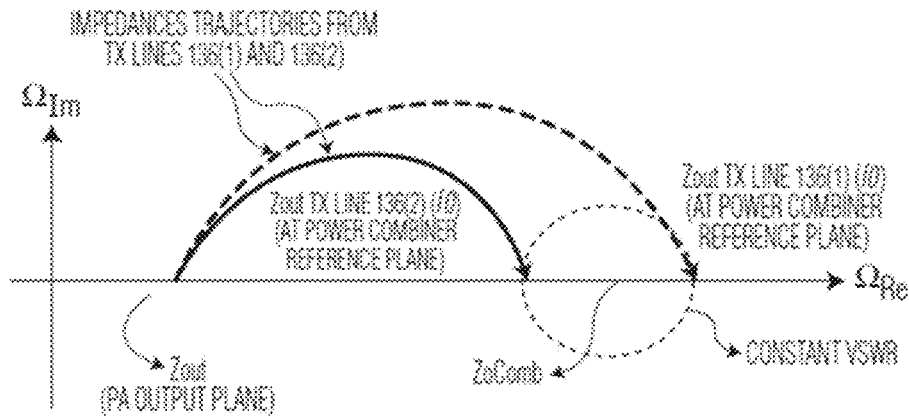
FIG. 4 is a graphical representation of the trajectories of the impedance transformations imposed by two example transmission lines of FIG. 1 having the same voltage standing wave ratio (VSWR) at the fundamental frequency f0.

FIG. 4 is a graphical representation of the trajectories of the impedance transformations imposed by two example transmission lines 136(1) and 136(2) of FIG. 1 having the same VSWR at f0, where the dashed circle represents all of the locations in the complex impedance plane having the same VSWR for the impedance ZoComb from the combiner 140. In the example of FIG. 4, the two amplifiers 132(1) and 132(2) of FIG. 1 have the same output impedance Zout at f0. As such, the two impedance trajectories start at the same Zout location in the complex impedance plane. Although the two transmission lines 136(1) and 136(2) have different electrical characteristics at f0 (resulting in two different impedance trajectories), those transmission lines are designed such that they both end up at two different locations having the same VSWR at f0 for the combiner impedance ZoComb, where those two different locations are both on the real impedance axis ($\Omega_{Re}$). As such, the two amplified signals 138(1) and 138(2) will be combined in phase at the hybrid power combiner 140 at f0. However, the phase offset at 2f0 will typically not be appropriate to compensate for the phase-offset deficit at the power combiner 140.

Figure 5:
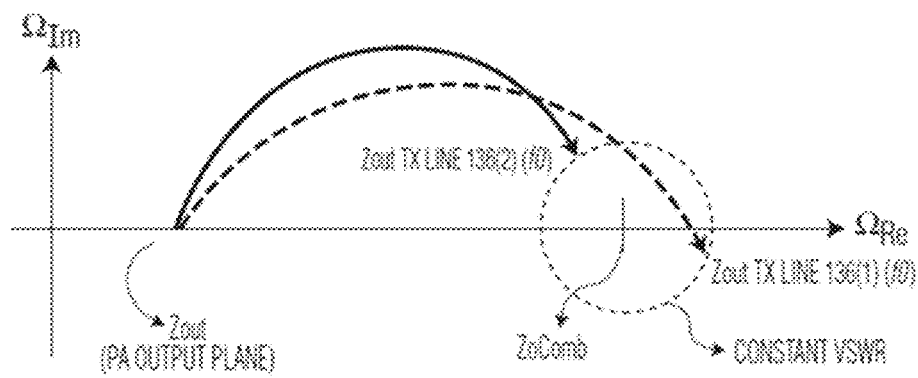
FIG. 5 is a graphical representation of the trajectories of the impedance transformations imposed by another two example transmission lines of FIG. 1 having the same VSWR at f0.

FIG. 5 is a graphical representation of the trajectories of the impedance transformations imposed by another two example transmission lines 136(1) and 136(2) of FIG. 1 having the same VSWR at f0. Here, too, the two amplifiers 132(1) and 132(2) of FIG. 1 have the same output impedance Zout at f0, such that the two impedance trajectories again start at the same Zout location in the complex impedance plane. In this case, the two transmission lines 136(1) and 136(2) have different electrical characteristics at f0 (resulting in two different impedance trajectories) that are designed such that they both end up at two different locations having the same VSWR at f0 for the combiner impedance ZoComb, where neither of those two different locations is on the real impedance axis ($\Omega_{Re}$). Nevertheless, here, too, the two amplified signals 138(1) and 138(2) will be combined at the hybrid power combiner 140 in phase at f0, but typically not 180 degrees out of phase at 2f0.

Figure 6:
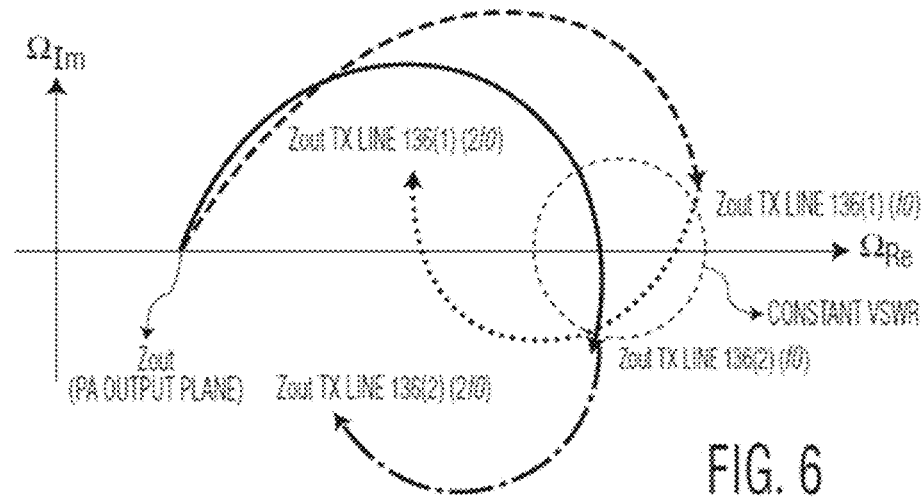
FIG. 6 is a graphical representation of the trajectories of the impedance transformations imposed by two example transmission lines of FIG. 3.

FIG. 6 is a graphical representation of the trajectories of the impedance transformations imposed by two example transmission lines 336(1) and 336(2) of FIG. 3. Here, too, the two amplifiers 332(1) and 332(2) of FIG. 3 have the same output impedance Zout at f0, such that the two impedance trajectories again start at the same Zout location in the complex impedance plane. In this case, however, the two transmission lines 336(1) and 336(2) have different electrical characteristics at f0 (resulting in two different impedance trajectories) that are designed such that they both end up at two different locations having slightly different VSWRs at f0 for the combiner impedance ZoComb, where neither of those two different locations is on the real impedance axis ($\Omega_{Re}$).

Also shown in FIG. 5 are impedance trajectories for the two transmission lines 336(1) and 336(2) at the second harmonic frequency 2f0, which end at very different locations on the complex impedance plane. In this example, the transmission lines 336(1) and 336(2) have been specifically designed such that there will be significant cancellation (i.e., destructive interference) at the power combiner 340 at 2f0 without significantly interfering with the phase matching (i.e., constructive interference) at f0. In particular, the two transmission lines 336(1) and 336(2) impose a complementary phase offset at 2f0 that is substantially identical to the 2f0 non-zero phase-offset deficit at the hybrid power combiner 340, while imposing a phase offset at f0 that is substantially close to zero.

In the example of FIG. 6, the different electrical characteristics of the transmission lines 336(1) and 336(2) may result in the two transmission lines having different power reflection coefficients Γ at 2f0. Different power reflection coefficients Γ represent different equivalent transmission phase angles Ø as given by Equation (7).

Design Example

Figure 7:
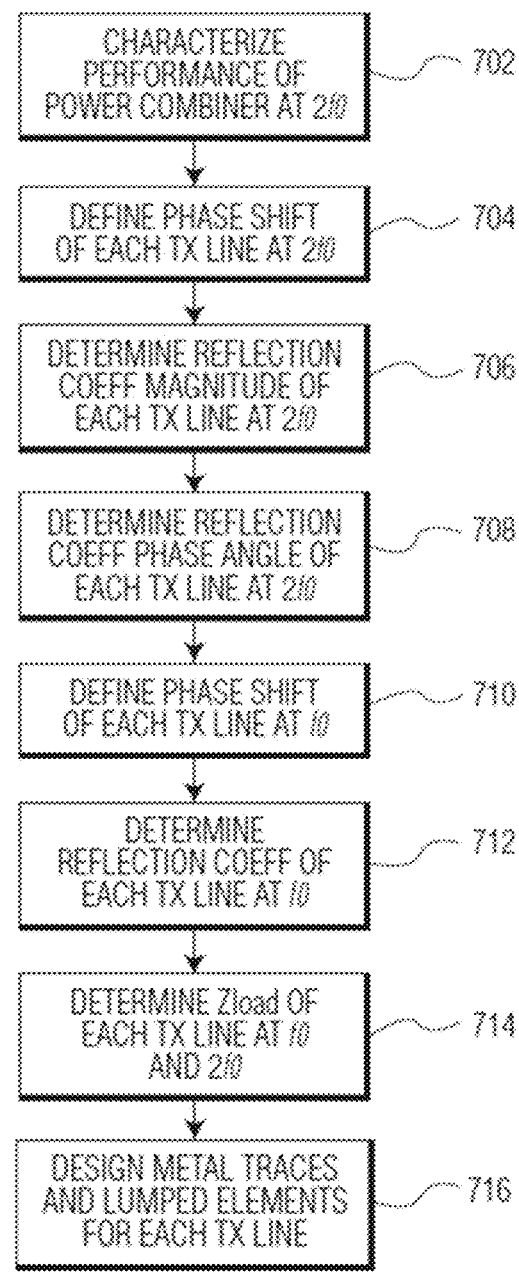
FIG. 7 is a flow diagram of the process for implementing the transmission lines of FIG. 3 on a printed circuit board according to one embodiment of the disclosure.

FIG. 7 is a flow diagram of a technique for implementing the transmission lines 336(1) and 336(2) of FIG. 3 on a printed circuit board according to one embodiment of the present disclosure. This section describes the flow diagram of FIG. 7 in the context of a particular design example of the dual-path power amplifier 300 of FIG. 3. According to this design example, the impedance Zout from each amplifier 332 is 27 ohms, and the impedance ZoComb from the power combiner 340 is 50 ohms. The goal of the technique is to design both transmission lines 336(1) and 336(2) to have approximately the same magnitude ρ of the power reflection coefficient Γ at the fundamental frequency f0. The range of values for ρ is from 0 to 1, where ρ=1 is a worst-case scenario where all of the incident signal reaching a load is reflected based to the signal source (i.e., total signal loss). In a perfect system where all of the incident signal goes into the load (i.e., no signal loss), ρ=0. A value of ρ=0.1 corresponds to a practical and acceptable real-world situation in which about 90% of the incident signal goes into the load and only about 10% is reflected back. For the design example, it is assumed that ρ=0.1, where the phase offset between the two transmission lines at the second harmonic frequency 2f0 plus the phase offset of the power combiner 340 is substantially close to 180 degrees.

In step 702 of FIG. 7, the performance of the hybrid coupler used to implement the power combiner 340 is characterized at the second harmonic frequency 2f0. In particular, the phase shift from the power combiner's first input port to the power combiner's output port at 2f0 and the phase shift from the power combiner's second input port to the power combiner's output port at 2f0 are independently measured. The phase offset of the power combiner 340 is the difference between those two measured phase shifts. In this design example, the phase offset of the power combiner 340 is 135 degrees. As such, the goal is to determine the impedance characteristics of the two transmission paths 336(1) and 336(2) that will achieve a complementary phase offset substantially equal to 45 degrees at 2f0 such that the total phase offset for the two signals will be substantially equal to 180 degrees at 2f0 in order for second-order harmonic signal energy in those two signals to destructively interfere in the power combiner 340, thereby enabling the generation of an amplified output signal 142 having significantly reduced or negligible harmonic distortion.

In step 704, an amount of phase shift Ø for each transmission line 336(1), 336(2) at 2f0 is defined. In this design example, the phase shift $Ø_1$ for the first transmission line 336(1) at 2f0 is −39 degrees, and the phase shift $Ø_2$ for the second transmission line 336(2) at 2f0 is +6 degrees, such that the phase offset between the two transmission lines at 2f0 will be 45 degrees. Because the phase shift $Ø_2$ at 2f0 for the second transmission line 136(2) is only +6 degrees, the implementation of that second transmission line 136(2) as a PCB metal trace can be similar to the metal trace 236(2) of the prior-art implementation 200. As such, only the design of the PCB metal trace for the implementation of the first transmission line 136(1) having a phase shift $Ø_1$ at 2f0 of −39 degrees will need to be optimized to meet the physical layout constraints on the PCB.

In step 706, the magnitude p of the power reflection coefficient Γ for each transmission line 336(1), 336(2) at 2f0 is determined. For this design example, the ratio of the power reflection coefficient magnitude $ρ_1$ for the first transmission line 336(1) to the power reflection coefficient magnitude $ρ_2$ for the second transmission line 336(2) at 2f0 is 3.85:1. The ratio 3.85:1 is related to the phase shifts $Ø_1$ and $Ø_2$ of the first and second transmission lines 136(1) and 136(2) and the designed phase offset between them. Furthermore, for this design example, the power reflection coefficient magnitude $ρ_1$ for the first transmission line 336(1) at 2f0 is 0.64. As understood by those skilled in the art, the value of 0.64 for $ρ_1$ was selected using a Smith chart plot for microwave amplifier design. As such, given the 3.85:1 ratio, the power reflection coefficient magnitude $ρ_2$ for the second transmission line 336(2) at 2f0 is 0.166.

In step 708, the phase angle θ of the power reflection coefficient Γ for each transmission line 336(1), 336(2) at 2f0 is determined. Using Equation (7), given that $Ø_1=-39$ degrees and that $ρ_1=0.64$, the phase angle $θ_1$ for the power reflection coefficient $Γ_1$ for the first transmission line 336(1) at 2f0 is determined to be −138.3 degrees. Similarly, given that $Ø_2=+6$ degrees and that $ρ_2=0.166$, the phase angle $θ_2$ for the power reflection coefficient $Γ_2$ for the second transmission line 336(2) at 2f0 is determined to be +149.2 degrees.

In step 710, an amount of phase shift Ø for each transmission line 336(1), 336(2) at the fundamental frequency f0 is defined. In this design example, the phase offset between the two transmission lines at f0 was selected to be 8 degrees, where an 8-degree phase offset at f0 corresponds to relatively small impact to the overall power level of the amplified output signal 150 at f0. In particular, in this design example, the first transmission line 336(1) is designed to have a phase angle $Ø_1$ at f0 equal to −3 degrees, and the second transmission line 336(2) is designed to have a phase angle θ2 at f0 equal to +5 degrees, such that the phase offset between the two transmission lines will be 8 degrees. These phase angles $Ø_1$ and $Ø_2$ at f0 are obtained as a direct result of values for the power reflection coefficients $Γ_1$ and $Γ_2$ at 2f0.

In step 712, the power reflection coefficients Γ for the first and second transmission lines 336(1) and 336(2) at f0 are determined. Using Equation (7) in an iterative manner, given that the phase angle $Ø_1$ for the first transmission line 336(1) at f0 is −3 degrees and with a goal of 0.1 for the power reflection coefficient magnitude $ρ_1$, the power reflection coefficient magnitude $ρ_1$ at f0 is determined to be 0.185, and the power reflection coefficient phase angle $θ_1$ at f0 is determined to be +155.6 degrees. Similarly, given that the phase angle $Ø_2$ for the second transmission line 336(2) at f0 is +5 degrees and with a goal of 0.1 for the power reflection coefficient magnitude $ρ_2$, the power reflection coefficient magnitude $ρ_2$ at f0 is determined to be 0.098, and the power reflection coefficient phase angle $θ_2$ at f0 is determined to be −41.01 degrees.

In step 714, the impedances Zload presented to the power combiner 340 by each transmission line 336(1), 336(2) at f0 and 2f0 are determined. Using Equation (6), given ZoComb=50 ohms and $Γ_1(f0)=(ρ_1=0.185, θ_1=+155.6$ degrees) (in polar coordinates), the impedance Zload for the first transmission line 336(1) at f0 (i.e., $Zload_1(f0)$) is determined to be (35.2+j5.63) ohms. Similarly, given ZoComb=50 ohms and $Γ_1(2f0)=(0.641, -138.3$ degrees), the impedance $Zload_1(2f0)$ for the first transmission line 336(1) is determined to be (12.4−j18.0) ohms. Similarly, given ZoComb=50 ohms and $Γ_2(f0)=(0.098, -41.01$ degrees), the impedance $Zload_2(f0)$ for the second transmission line 336(2) is determined to be (57.5−j7.5) ohms. Similarly, given ZoComb=50 ohms and $Γ_2(2f0)=(0.166, +149.2$ degrees), the impedance $Zload_2(2f0)$ for the second transmission line 336(2) is determined to be (37.0+j6.5) ohms.

In step 716, the first and second transmission lines 336(1) and 336(2) are implemented as two metal traces with two lumped capacitors on a printed circuit board that transform the Zout impedance from the amplifiers 332(1) and 332(2) to the Zload impedances presented to the power combiner 340 at f0 and 2f0. For this design example, the first transmission line 336(1) should be implemented to transform the 27-ohm Zout impedance to $Zload_1(f0)=(35.2+j5.63)$ ohms and to $Zload_1(2f0)=(12.4-j18.0)$ ohms. Similarly, the second transmission line 336(2) should be implemented to transform the 27-ohm Zout impedance to $Zload_2(f0)=(57.5-j7.5)$ ohms and to $Zload_1(2f0)=(37.0+j6.5)$ ohms.

Transmission lines can be implemented in many different ways to achieve desired impedance transformations. For example, a transmission line can be implemented using a metal trace having one or more serially connected trace segments, where each trace segment corresponds to a different physical section of the metal trace that performs a different portion of the overall impedance transformation of the transmission line. In addition, the transmission line can be implemented using one or more lumped elements connected to the metal trace where the one or more lumped elements also perform one or more different portions of the overall impedance transformation of the transmission line. In this design example, each transmission line 336(1), 336(2) is implemented as a metal trace having three trace segments and one lumped capacitor connected as a shunt capacitor between the metal trace and a ground terminal.

Using Equations (8) and (9) in an iterative manner, given Zout=27 ohms and the two different $Zload_1$ values at f0 and 2f0, the different portions of the overall impedance transformations corresponding to the three trace segments and the lumped capacitor for the first transmission line 336(1) can be determined. Similarly, given Zout=27 ohms and the two different $Zload_2$ values at f0 and 2f0, the different portions of the overall impedance transformations corresponding to the three trace segments and the lumped capacitor for the second transmission line 336(2) can also be determined.

Table I presents the results of this iterative processing. In Table I, Zbegin refers to the impedance at the beginning of a portion of the overall impedance transformation for a transmission line at either f0 or 2f0, and Zend refers to the impedance at the end of that portion. The length λ is the number of wavelengths corresponding to that portion at either f0 or 2f0, and Zo is the impedance of that portion. For example, the first entry in Table I corresponds to the first trace segment of the first transmission line 336(1) at f19, where that first trace segment has a beginning impedance Zbegin of (35.2+j5.63) ohms at f0 and an ending impedance Zend of (31.2+j12.1) at f0. To achieve that portion of the overall impedance transformation of the first transmission line 336(1) at f0, the first trace segment has a length λ of 0.013 wavelengths and an impedance Zo of 11.8 ohms.

TABLE I

| Tx Line | Freq | Portion | Zbegin (ohms) | Zend (ohms) | Length (λ) | Zo | |
|---|---|---|---|---|---|---|---|
| First | f0  | 1st Segmt | 35.2 + j5.63 | 31.2 + j12.1 | 0.013 | 11.8 | ohms |
| First | f0  | 2nd Segmt | 31.2 + j12.1 | 20.0 − j0.0  | 0.152 | 29.9 | ohms |
| First | f0  | 3rd Segmt | 20.0 − j0.0  | 22.3 − j9.7  | 0.055 | 39.5 | ohms |
| First | f0  | Capacitor | 22.3 − j9.7  | 27           | —     | 2.7  | pF   |
| First | 2f0 | 1st Segmt | 12.4 − j18.0 | 21.2 − j21.5 | 0.026 | 11.8 | ohms |
| First | 2f0 | 2nd Segmt | 21.2 − j21.5 | 14.0 + j11.6 | 0.304 | 29.9 | ohms |
| First | 2f0 | 3rd Segmt | 14.0 + j11.6 | 14.5 − j13.3 | 0.110 | 39.5 | ohms |
| First | 2f0 | Capacitor | 14.5 − j13.3 | 27           | —     | 2.7  | pF   |

TABLE I-continued

| Tx Line | Freq | Portion | Zbegin (ohms) | Zend (ohms) | Length (λ) | Zo |
|---|---|---|---|---|---|---|
| Second | f0 | $1^{st}$ Segmt | 57.5 − j7.5 | 57.2 + j8.8 | 0.030 | 29.2 ohms |
| Second | f0 | $2^{nd}$ Segmt | 57.2 + j8.8 | 53.4 + j8.6 | 0.035 | 55.0 ohms |
| Second | f0 | $3^{rd}$ Segmt | 53.4 + j8.6 | 27 − j0.8 | 0.2225 | 38.9 ohms |
| Second | f0 | Capacitor | 27 − j0.8 | 27 | — | 0.2 pF |
| Second | 2f0 | $1^{st}$ Segmt | 37 + j6.5 | 29.6 + j11 | 0.060 | 29.2 ohms |
| Second | 2f0 | $2^{nd}$ Segmt | 29.6 + j11 | 29.5 − j8.6 | 0.070 | 55.0 ohms |
| Second | 2f0 | $3^{rd}$ Segmt | 29.5 − j8.6 | 26.8 − j1.9 | 0.445 | 38.9 ohms |
| Second | 2f0 | Capacitor | 26.8 − j1.9 | 27 | — | 0.2 pF |

Note that, in Table I, the different portions of each overall impedance transformation are described starting from the corresponding input of the power combiner 340 and progressing back to the output of the corresponding amplifier 332(1), 332(2). Thus, the impedance at the beginning of the first trace segment of the first transmission line 336(1) at f0 is the impedance at the first input of the power combiner 140 at f0, and the impedance at the "end" of the lumped capacitor is the impedance at the output of the first amplifier 332(1) (e.g., 27 ohms). As such, as reflected in Table I, the impedance at the end of the first trace segment of the first transmission line 336(1) at f0 is the same as the impedance at the beginning of the second trace segment of the first transmission line 336(1) at f0. Similarly, the impedance at the end of the second trace segment of the first transmission line 336(1) at f0 is the same as the impedance at the beginning of the third trace segment of the first transmission line 336(1) at f0, and the impedance at the end of the third trace segment of the first transmission line 336(1) at f0 is the same as the impedance at the "beginning" of the lumped capacitor at f0. These same characteristics apply to the first transmission line 336(1) at 2f0 and to the second transmission line 336(2) at both f0 and 2f0.

Since impedances of series-connected elements are sequentially additive, the three different trace segments and the lumped capacitor of Table I are implemented sequentially as described to achieve the desired impedance transformation. Other implementations may involve different sequences of trace segments and/or lumped elements.

For PCB-based implementations in which the transmission lines 336(1) and 336(2) are implemented using two metal traces and lumped elements on a PCB, the design strategy of FIG. 7 involves purposely designing the two transmission lines to provide different impedance transformations at the second harmonic frequency 2f0 in order to achieve different amounts of phase shift at 2f0 in the two different amplified signals that arrive at the power combiner 340, such that the resulting output signal 342 will have reduced distortion at the second harmonic frequency without significantly impacting the power level of the output signal at the fundamental frequency. In typical implementations of this design strategy, the two different metal traces will have different physical configurations (e.g., lengths, widths, shapes) that are not identical (e.g., not mirror images of each other).

Those skilled in the art understand that a trace segment can be designed in different ways to achieve a given impedance, where, in general, impedance is a function of length, thickness, width, and material composition of the trace segment. The design of a metal trace may be impacted by external constraints such as the available footprint on the PCB and the particular metal to be used.

Figure 8:
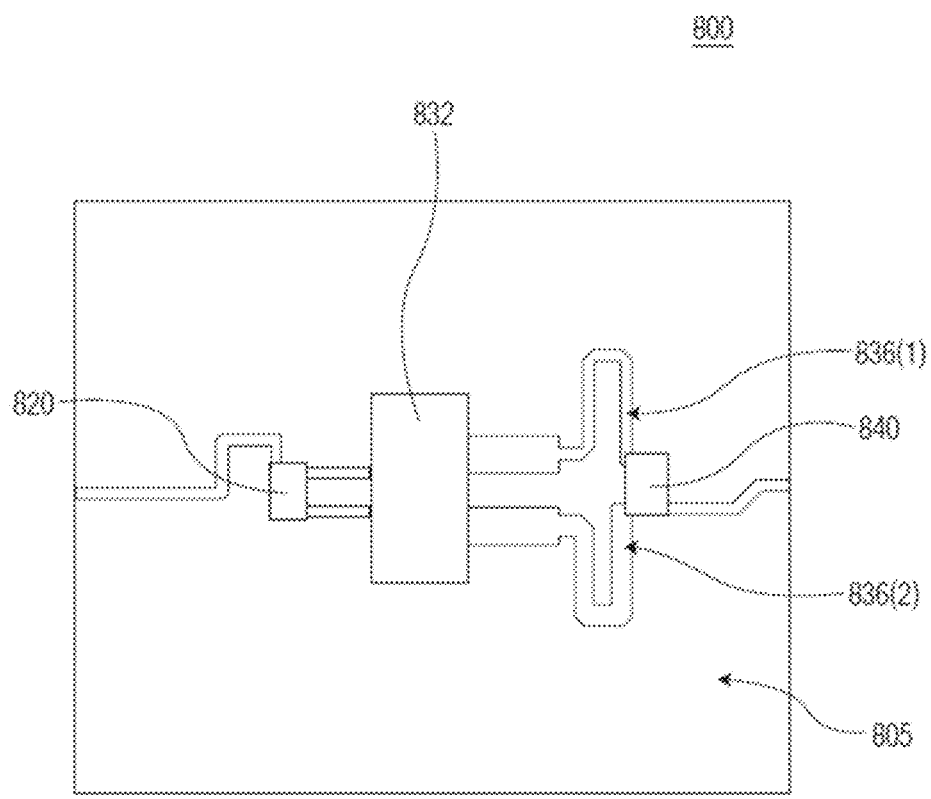
FIG. 8 is a simplified, top view of a PCB-based implementation of the dual-path amplifier of FIG. 3, according to certain embodiments of the present disclosure.

FIG. 8 is a simplified, top view of a PCB-based implementation 800 of the dual-path amplifier 300 of FIG. 3, according to certain embodiments of the present disclosure. As shown in FIG. 8 and similar to the conventional PCB-based implementation 200 of FIG. 2, the power splitter 320 and the power combiner 340 of FIG. 3 may be respectively implemented using two symmetric instances 820 and 840 of the same discrete, hybrid coupler that are mounted onto the PCB 805. Also mounted onto the PCB 805 is a packaged IC device 832 that contains the two amplifiers 332(1) and 332(2) of FIG. 3. In an alternative embodiment, each amplifier 332(1), 332(2) may be implemented in a separate packaged IC device. In one possible implementation, the hybrid power splitter 820 and the hybrid power combiner 840 are two instances of an X3C09P1-03S 3 dB 90-deg Xinger Hybrid Coupler 800-1000 MHz from Anaren of East Syracuse, N.Y., and the packaged IC device 832 is an A2I09VD050 RF Amplifier from NXP Semiconductors of Eindhoven, Netherlands.

As shown in FIG. 8, the two transmission lines 336(1) and 336(2) of FIG. 3 are implemented using two respective metal traces 836(1) and 836(2) on the PCB 805. Note that, in this case and unlike the situation in the conventional implementation 200 of FIG. 2, the physical layouts of the two metal traces 836(1) and 836(2) are intentionally designed not to be identical (e.g., not to be mirror images of each other), such that the two transmission lines 336(1) and 336(2) will have different electrical characteristics at the second harmonic frequency 2f0 such that the two, second harmonic signal components 338(1) and 338(2) of FIG. 3 will arrive at the hybrid power combiner 840 with a complementary phase offset at 2f0 that substantially compensates for the non-zero phase-offset deficit of the hybrid power combiner 840. In particular, in this example, the metal trace 836(2) has certain trace segments that are wider than the corresponding trace segments of the metal trace 836(1) In addition, the two metal traces 836(1) and 836(2) may be designed such that the transmission lines 336(1) and 336(2) will have sufficiently similar electrical characteristics at the fundamental frequency f0 such that there will be minimal power loss and distortion in the output signal 342 at the output node 350 of the power amplifier 300 at f0. In particular, the goal is to design the two metal traces 836(1) and 836(2) to have different and independent electrical characteristics that do not introduce significant losses at the fundamental frequency f0 but do introduce a desired phase offset between the two signal components 338(1) and 338(2) at the second harmonic frequency 2f0.

The total RF source signal phase offset at 2f0 between the two transmission lines 336(1) and 336(2) at the combining port reference plane (i.e., inside the hybrid power combiner 840) should be close to 180 degrees out of phase to achieve significant secondary harmonic cancellation. Due to physical dimensions limitations, the power combiner 840 fails to provide enough phase offset to achieve the full required 180 degrees. The proposed design takes advantage of the phase offset that is available and inherent in the power combiner 840 at 2f0 and complements that phase offset with additional phase offset coming from the designed transmission lines 336(1) and 336(2). The resultant accumulated total phase offset at 2f0 will be sufficient to induce significant secondary harmonic cancellation without significantly impacting the power of the amplified output signal at f0.

According to an embodiment, the different electrical characteristics of the two transmission lines 336(1) and 336(2) are implemented by designing the metal traces 836(1) and 836(2) with different physical and electrical characteristics. For example, each of the metal traces 836(1) and 836(2) has a first end (input end) coupled to an amplifier output, and a second end (output end) coupled to an input port of the power combiner 840, where each metal trace is made up of metal trace segments whose physical characteristics (e.g., length, width, shape, material) are selected to achieve desired electrical characteristics. As an example, all other things being equal, doubling the width of one metal trace relative to the width of the other metal trace will result in the wider trace having an impedance that is half the impedance of the other trace, which will in turn increase the phase offset between the two traces at 2f0.

Although embodiments have been described in the context of the second harmonic frequency, in general, embodiments of the present disclosure can be designed for other harmonic frequencies in addition to or instead of the second harmonic frequency.

According to certain embodiments, disclosed is a dual-path amplifier configured to operate at a fundamental frequency of operation. The dual-path amplifier comprises a power splitter, first and second power amplifiers, first and second transmission lines, and a power combiner. The power splitter is configured to split an input signal into first and second signal components. The first power amplifier is configured to amplify the first signal component to generate a first amplified signal component, and the second power amplifier is configured to amplify the second signal component to generate a second amplified signal component. The first transmission line is configured to receive the first amplified signal component and output a first transformed amplified signal component, and the second transmission line is configured to receive the second amplified signal component and output a second transformed amplified signal component. The power combiner is configured to combine the first and second transformed amplified signal components to generate an amplified output signal. The first and second transmission lines are configured to compensate for a non-zero phase-offset deficit in the power combiner at a harmonic of the fundamental frequency such that the first and second transmission lines and the power combiner reduce distortion in the amplified output signal at the harmonic frequency.

According to certain embodiments, disclosed is a method of amplifying an input signal to generate an amplified output signal. The method comprises splitting the input signal into first and second signal components; amplifying the first signal component to generate a first amplified signal component; amplifying the second signal component to generate a second amplified signal component; transmitting the first amplified signal component along a first transmission line to output a first transformed amplified signal component; transmitting the second amplified signal component along a second transmission line to output a second transformed amplified signal component; and combining the first and second transformed amplified signal components at a power combiner to generate an amplified output signal. The first and second transmission lines compensate for a non-zero phase-offset deficit in the power combiner at a harmonic frequency of a fundamental frequency such that the first and second transmission lines and the power combiner reduce distortion in the amplified output signal at the harmonic frequency.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A dual-path amplifier configured to amplify signals with first components at a fundamental frequency of operation and second components at a second harmonic frequency of the fundamental frequency, the dual-path amplifier comprising:

a first power amplifier configured to receive and amplify a first signal to generate a first amplified signal at an output of the first power amplifier;

a second power amplifier configured to receive and amplify a second signal to generate a second amplified signal at an output of the second power amplifier;

a power combiner with a first input port, a second input port, and a combining port coupled to the first and second input ports, wherein prior to combining first and second transformed amplified signals at the combining port, the power combiner applies a first phase offset between components of the first and second transformed amplified signals at the second harmonic frequency, and wherein the first phase offset is 180 degrees minus a non-zero phase-offset deficit of up to 80 degrees;

a first transmission line with a first end connected to the output of the first power amplifier, and a second end connected to the first input port of the power combiner, wherein the first transmission line is configured to receive the first amplified signal from the first power amplifier at the first end of the first transmission line, and to produce the first transformed amplified signal at the second end of the first transmission line, and wherein the first transmission line is characterized by a first impedance, a first width, a first electrical length between the first and second ends of the first transmission line at the fundamental frequency, and a second electrical length between the first and second ends of the first transmission line at the second harmonic frequency; and a second transmission line with a first end connected to the output of the second power amplifier, and a second end connected to the second input port of the power combiner, wherein the second transmission line has different physical and electrical characteristics from the first transmission line, and the second transmission line is configured to receive the second amplified signal from the second power amplifier at the first end of the second transmission line, and to produce the second transformed amplified signal component at the second end of the second transmission line, and wherein the second transmission line is characterized by a second impedance that is substantially lower than the first impedance, a second width that is substantially wider than the first width, a third electrical length between the first and second ends of the second transmission line at the fundamental frequency that is substantially equal to the first electrical length, and a fourth electrical length between the first and second ends of the second transmission line at the second harmonic frequency that is substantially different from the second electrical length, and wherein the first and second transmission lines do not apply a phase offset between the first and second transformed amplified signals at the fundamental frequency, wherein the different physical and electrical characteristics of the first and second transmission lines result in the first and second transmission lines applying a non-zero second phase offset between the first and second transformed amplified signals at the second harmonic frequency, and wherein the non-zero second phase offset applied by the first and second transmission lines at the second harmonic frequency plus the non-zero phase offset deficit of the power combiner is at or near 180 degrees so that the components of the first and second transformed amplified signals at the second harmonic frequency destructively interfere with each other at the combining port.

2. The dual-path amplifier of claim 1, wherein the first and second transmission lines comprise respective first and second metal traces on a printed circuit board (PCB).

3. The dual-path amplifier of claim 2, wherein:
the first transmission line imposes a first impedance transformation at the second harmonic frequency that results in a first phase shift at the second harmonic frequency; and
the second transmission line imposes a second impedance transformation at the second harmonic frequency that results in a second phase shift at the second harmonic frequency, wherein a non-zero difference between the first and second phase shifts at the second harmonic frequency substantially compensates for the non-zero phase-offset deficit of the power combiner.

4. The dual-path amplifier of claim 2, wherein the first and second metal traces are not mirror images of each other.

5. The dual-path amplifier of claim 1, wherein the first and second transmission lines each further comprise one or more lumped elements mounted on the PCB and connected to a corresponding metal trace.

6. The dual-path amplifier of claim 1, further comprising:
a power splitter configured to split an input signal into the first and second signals, wherein components of the first and second signals at the fundamental frequency have a third phase offset of 90 degrees, and
wherein the power combiner applies a fourth phase offset between the first and second transformed amplified signals at the fundamental frequency so that components of the first and second transformed amplified signals at the fundamental frequency constructively interfere with each other at the combining port.

* * * * *